(12) United States Patent
Lee et al.

(10) Patent No.: US 8,928,098 B2
(45) Date of Patent: Jan. 6, 2015

(54) SEMICONDUCTOR PACKAGE AND FABRICATION METHOD THEREOF

(71) Applicant: Xintec Inc., Jhongli (TW)

(72) Inventors: Hung-Jen Lee, Jhongli (TW);
Shu-Ming Chang, Jhongli (TW);
Tsang-Yu Liu, Jhongli (TW); Yen-Shih Ho, Jhongli (TW)

(73) Assignee: Xintec, Inc., Jhongli (TW)

( * ) Notice: Subject to any disclaimer, the term of this patent is extended or adjusted under 35 U.S.C. 154(b) by 53 days.

(21) Appl. No.: 13/714,218

(22) Filed: Dec. 13, 2012

(65) Prior Publication Data
US 2013/0168784 A1    Jul. 4, 2013

Related U.S. Application Data

(60) Provisional application No. 61/570,153, filed on Dec. 13, 2011.

(51) Int. Cl.
*B81B 7/00* (2006.01)
*B81C 1/00* (2006.01)

(52) U.S. Cl.
CPC ............. *B81B 7/007* (2013.01); *B81C 1/00301* (2013.01); *B81C 1/0023* (2013.01)
USPC ............................................ 257/415; 438/51

(58) Field of Classification Search
CPC .... B81B 7/007; B81C 1/0023; B81C 1/00301
USPC ................................................................. 257/723
See application file for complete search history.

(56) References Cited

U.S. PATENT DOCUMENTS

| | | | | |
|---|---|---|---|---|
| 5,798,283 | A * | 8/1998 | Montague et al. | 438/24 |
| 6,794,271 | B2 * | 9/2004 | Harris et al. | 438/456 |
| 6,836,366 | B1 * | 12/2004 | Flanders et al. | 359/578 |
| 8,227,285 | B1 * | 7/2012 | Yang | 438/50 |
| 2006/0152111 | A1 * | 7/2006 | Allison et al. | 310/328 |
| 2008/0296708 | A1 * | 12/2008 | Wodnicki et al. | 257/414 |
| 2009/0127638 | A1 * | 5/2009 | Kilger et al. | 257/415 |
| 2009/0148967 | A1 * | 6/2009 | Wodnicki et al. | 438/17 |
| 2010/0148210 | A1 * | 6/2010 | Huang et al. | 257/99 |
| 2012/0267773 | A1 * | 10/2012 | Ebefors et al. | 257/692 |
| 2013/0210175 | A1 * | 8/2013 | Hoisington et al. | 438/21 |

* cited by examiner

*Primary Examiner* — Long K Tran
*Assistant Examiner* — Jordan Klein
(74) *Attorney, Agent, or Firm* — Liu & Liu

(57) ABSTRACT

A semiconductor package includes: a chip having a first portion and a second portion disposed on the first portion, wherein the second portion has at least a through hole therein for exposing a portion of the first portion, and the first portion and/or the second portion has a MEMS; and an etch stop layer formed between the first portion and the second portion and partially exposed through the through hole of the second portion. The invention allows an electronic element to be received in the through hole so as for the semiconductor package to have integrated functions of the MEMS and the electronic element. Therefore, the need to dispose the electronic element on a circuit board as in the prior art can be eliminated, thereby saving space on the circuit board.

22 Claims, 7 Drawing Sheets

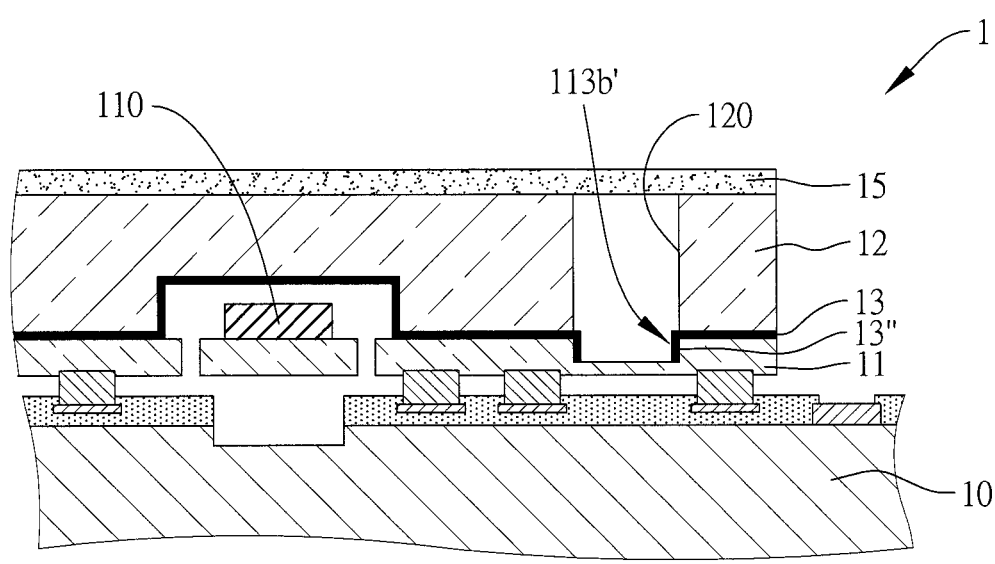
FIG. 3E"

SEMICONDUCTOR PACKAGE AND FABRICATION METHOD THEREOF

CROSS-REFERENCE TO RELATED APPLICATIONS

This application claims the benefit of U.S. Provisional Application No. 61/570,153, filed on Dec. 13, 2011, the entire contents of which is incorporated herein by reference.

BACKGROUND OF THE INVENTION

1. Field of the Invention

The present invention relates to semiconductor packages and fabrication methods thereof, and more particularly, to a semiconductor package having a micro-electro-mechanical system (MEMS) and a fabrication method thereof.

2. Description of Related Art

Along with the rapid development of electronic industries, electronic products are required to have multiple functions. Accordingly, semiconductor packages and electronic elements having various functions are generally disposed on a circuit board of an electronic product. However, along with the increase of the number of the semiconductor packages and the electronic elements, the circuit board is required to have more space for accommodating the semiconductor packages and the electronic elements and hence the size of the electronic product must be increased. Therefore, to meet the miniaturization requirement of electronic products, semiconductor packages are usually integrated with electronic elements so as to form MEMS packages, thereby saving space on circuit boards, reducing the size of the electronic products and meeting the multi-function requirement.

Currently, a semiconductor package can only be integrated with a MEMS element having a single function. As such, to meet the multi-function requirement of an electronic product, multiple semiconductor packages having different MEMS functions need to be disposed on a circuit board, which, however, adversely affects space reduction on the circuit board and the miniaturization of the electronic product.

Therefore, there is a need to provide a semiconductor package and a fabrication method thereof so as to overcome the above-described drawbacks.

SUMMARY OF THE INVENTION

In view of the above-described drawbacks, the present invention provides a fabrication method of a semiconductor package, which comprises the steps of: providing a wafer having a first portion and a second portion and an etch stop layer formed between the first and second portions, wherein the first portion and/or the second portion has a MEMS; etching the second portion so as to form at least a through hole in the second portion, thereby exposing a portion of the etch stop layer; and forming a protection layer on the second portion so as to form a sealed space in the through hole.

The present invention further provides a semiconductor package, which comprises: a chip having a first portion and a second portion formed on the first portion, wherein the second portion has at least a through hole therein for exposing a portion of the first portion, and the first portion and/or the second portion has a MEMS; and an etch stop layer formed between the first portion and the second portion and partially exposed through the through hole of the second portion.

The present invention allows an electronic element to be received in the through hole so as for the semiconductor package to have integrated functions of the MEMS and the electronic element. Therefore, the present invention eliminates the need to dispose the electronic element on a circuit board as in the prior art, thereby saving space on the circuit board.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'on', 'a' etc. are only used as a matter of descriptive convenience and not intended to have any other significance or provide limitations for the present invention.

The present invention provides semiconductor packages applicable to various kinds of micro-electro-mechanical systems (MEMS), especially image sensors that work by measuring changes in an electrical or capacitive property. In particular, wafer level packages can be applied to the semiconductor packages of image sensor elements, RF circuits, accelerators, gyroscopes, micro actuators or pressure sensors.

First Embodiment

FIGS. 1A to 1E are schematic cross-sectional views showing a fabrication method of a semiconductor package according to a first embodiment of the present invention.

Figure 1A:
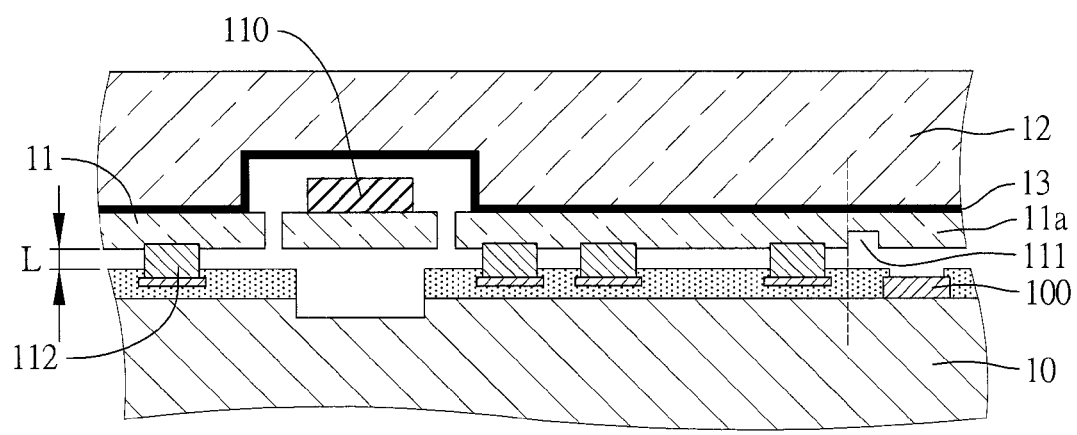
FIGS. 1A to 1F are schematic cross-sectional views showing a fabrication method of a semiconductor package according to a first embodiment of the present invention.

Referring to FIG. 1A, a substrate 10 is provided and a wafer is disposed on the substrate 10. The wafer has a first portion 11 with an etch stop layer 13 formed thereon and a second portion 12 formed on the etch stop layer 13 of the first portion 11.

In the present embodiment, the substrate 10 has a CMOS (Complementary Metal-Oxide-Semiconductor) wafer structure. In other embodiments, the substrate 10 can be, but not limited to, a ceramic circuit board or a metal plate.

The substrate 10 and the first portion 11 and the second portion 12 of the wafer form a wafer stack structure. The internal circuits of each of the wafers can be designed according to the practical need. Since the internal circuits are not the characteristic of the present invention, detailed description thereof is omitted herein.

Further, the substrate 10 has at least a conductive pad 100 disposed thereon. The first portion 11 of the wafer is electrically connected to the substrate 10. The first portion 11 has an electronic element such as a gyroscope 110 disposed therein so as to have a micro-electro-mechanical system (MEMS), and the second portion 12 of the wafer serves as a cover member. In other embodiments, the MEMS can be disposed in the second portion 12, or both in the first portion 11 and the second portion 12.

Furthermore, the first portion 11 of the wafer has a cover portion 11a corresponding in position to the conductive pad 100 and a recess 111 formed in the cover portion 11a. In addition, the first portion 11 is disposed on the substrate 10 through a plurality of bumps 112 so as to form a distance L between the first portion 11 and the substrate 10.

Figure 1B:
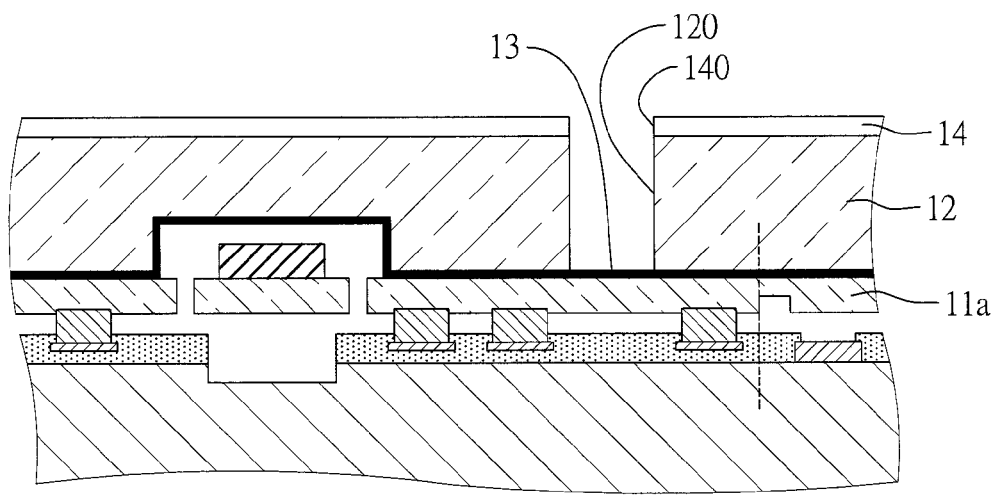

Referring to FIG. 1B, a resist layer 14 is formed on the second portion 12 of the wafer and patterned such that at least an opening 140 is formed in the resist layer 14 for exposing a portion of the second portion 12 of the wafer that is not located over the cover potion 11a.

Then, the exposed portion of the second portion 12 is etched to form a through hole 120 so as to expose a portion of the etch stop layer 13.

Figure 1C:
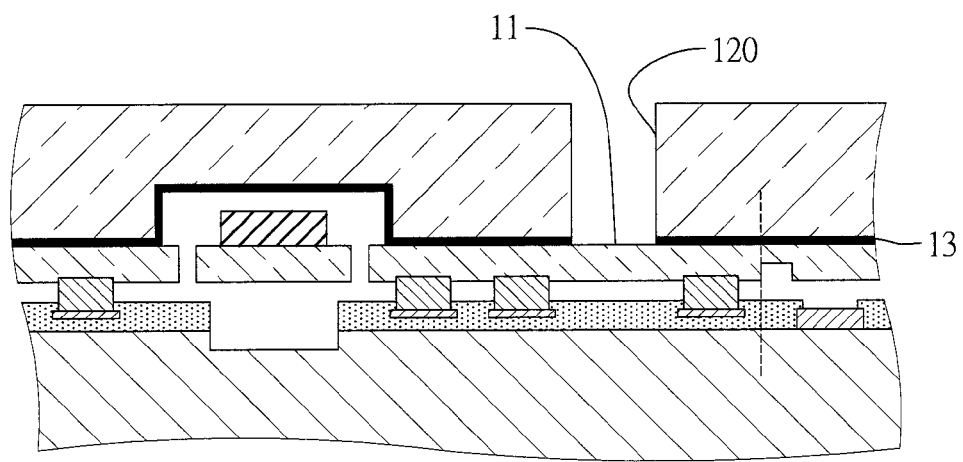

Referring to FIG. 1C, the resist layer 14 is removed. Then, the exposed portion of the etch stop layer 13 is removed by etching so as to expose a portion of the first portion 11 through the through hole 120.

Figure 1D:
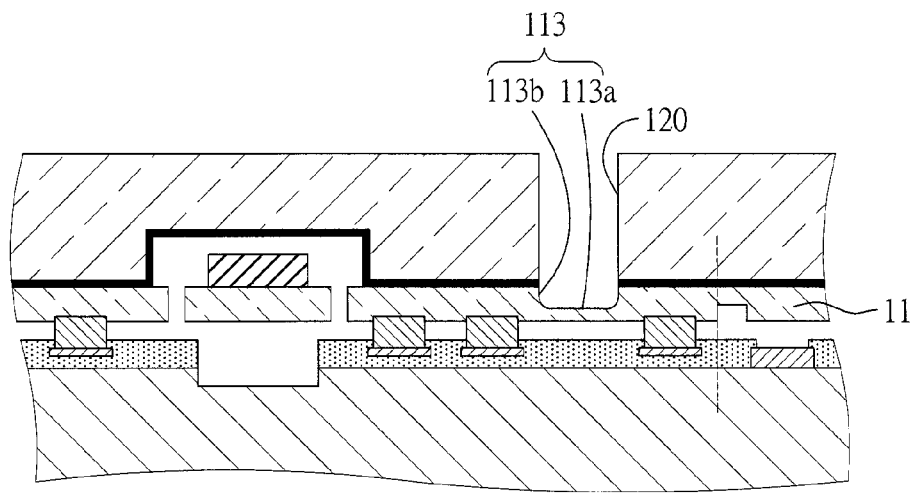

Referring to FIG. 1D, a portion of the first portion 11 in the through hole 120 is removed by etching so as to form a recess 113 in the first portion 11. The recess 113 has a bottom 113a and a sidewall 113b around the bottom 113a.

Since the etch stop layer 13 is made of a material different from the wafer, the etching solution for etching the etch stop layer 13 is different from the etching solution for etching the first and second portions 11, 12 of the wafer.

Figure 1E:
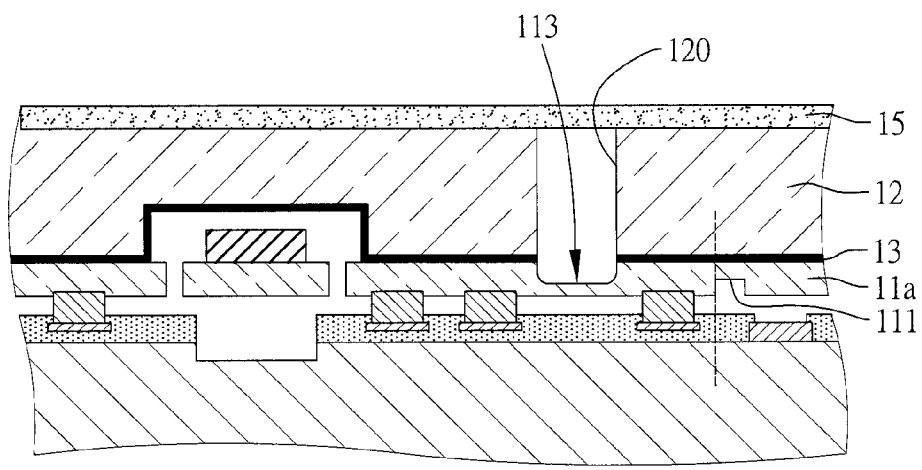

Referring to FIG. 1E, a protection layer 15 is formed on the second portion 12 of the wafer to cover the through hole 120, thereby forming a sealed space in the through hole 120 and the recess 113.

Figure 1F:
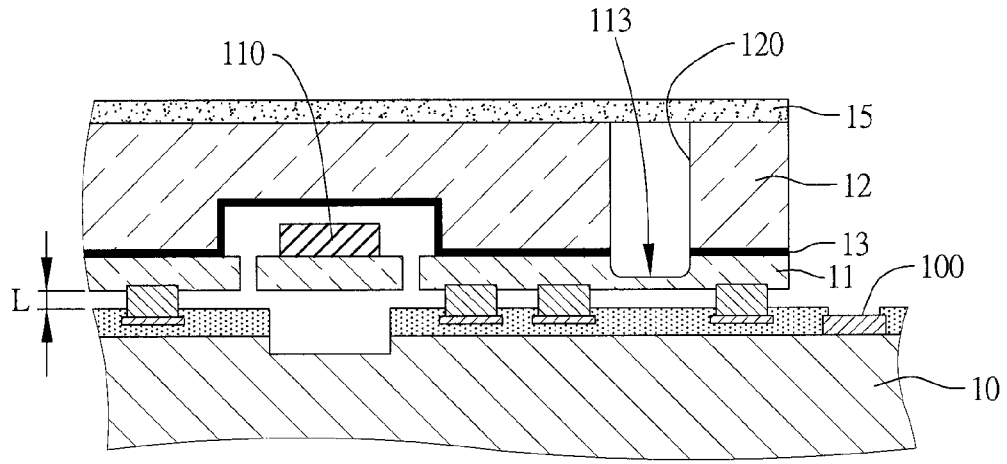

Referring to FIG. 1F, by performing a cutting process, the cover portion 11a and the etch stop layer 13, the second portion 12 and the protection layer 15 on the cover portion 11a are removed to expose the conductive pad 100 for electrically connecting another device (such as a circuit board) through such as wire bonding. The recess 111 facilitates the cutting and removal of the cover portion 11a and the etch stop layer 13, the second portion 12 and the protection layer 15 on the cover portion 11a.

In subsequent applications, the protection layer 15 can be removed. An electronic element such as a pressure sensor (not shown) can further be received in the through hole 120 and the recess 113 to sense changes in the distance L between the bottom 113a and the substrate 10, thereby determining the value of pressure applied on the package so as to facilitate operation of the gyroscope 110. Therefore, the present embodiment eliminates the need to dispose a pressure sensor or a semiconductor package having a pressure sensor on the circuit board (not shown), thus saving space on the circuit board.

In the present embodiment, the distance L between the first portion 11 and the substrate 10 is provided for the pressure sensor to sense changes in pressure. In other embodiment, the distance L may be dispensed with according to the type of the electronic element to be disposed in the through hole.

Second Embodiment

FIGS. 2A to 2F are schematic cross-sectional views showing a fabrication method of a semiconductor package according to a second embodiment of the present invention. The present embodiment is similar to the first embodiment. A main difference of the present embodiment from the first embodiment is the process for removing the cover portion, which is detailed as follows.

Figure 2A:
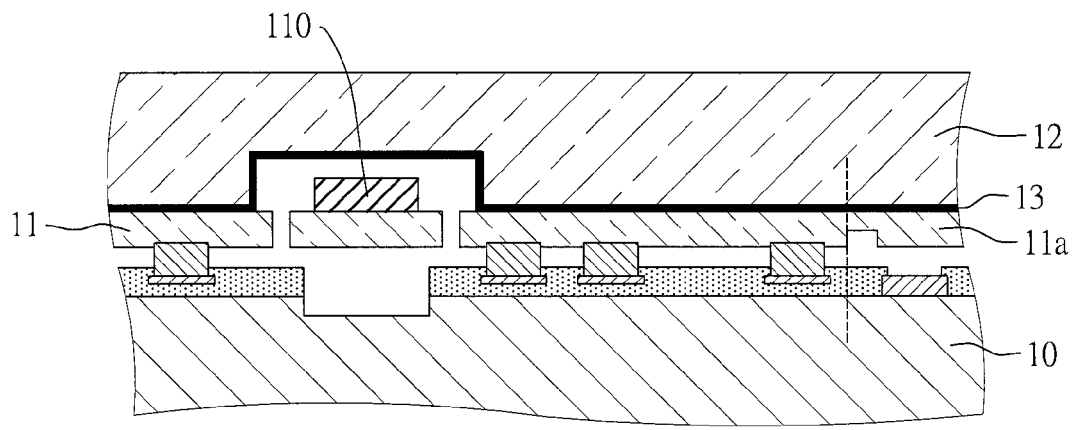
FIGS. 2A to 2F are schematic cross-sectional views showing a fabrication method of a semiconductor package according to a second embodiment of the present invention.

Referring to FIG. 2A, a structure as in FIG. 1A is obtained.

Figure 2B:
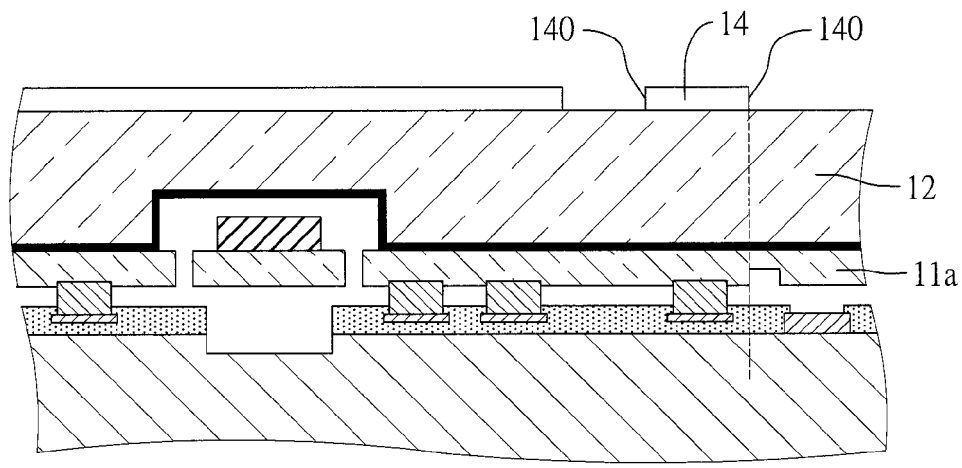

Referring to FIG. 2B, a resist layer 14 is formed on the second portion 12 of the wafer and patterned to form openings 140 in the resist layer 14 for exposing portions of the second portion 12. Different from the first embodiment, a portion of the second portion 12 located over the cover potion 11a is also exposed through one of the openings 140.

Figure 2C:
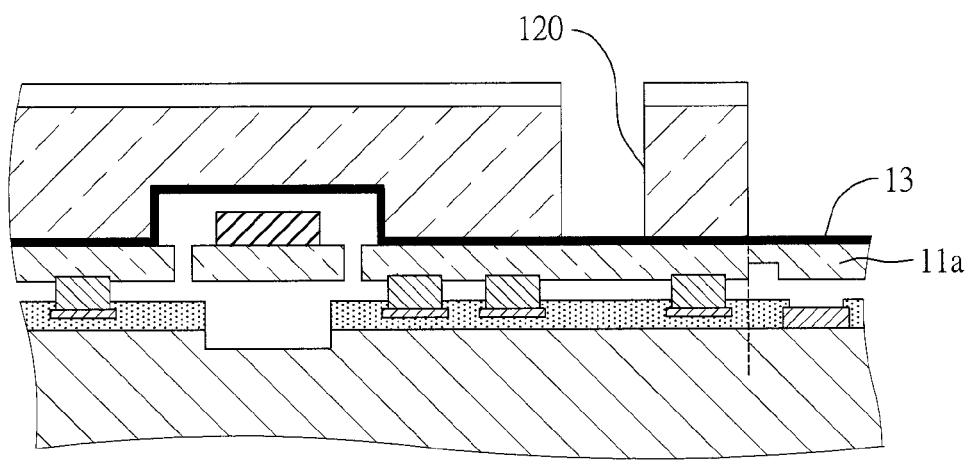

Referring to FIG. 2C, when a through hole 120 as in FIG. 1B is formed, the exposed portion of the second portion 12 over the cover portion 11a is also removed by etching so as to expose a portion of the etch stop layer 13 on the cover portion 11a.

Figure 2D:
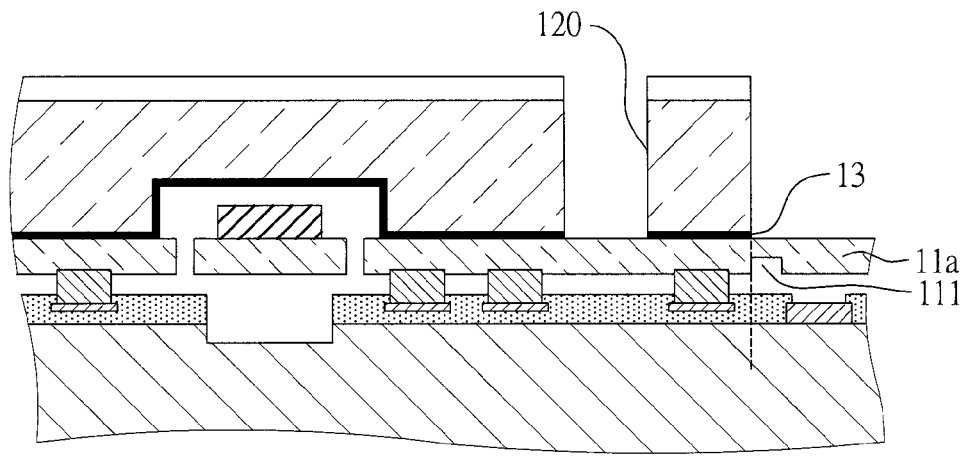

Referring to FIG. 2D, when the portion of the etch stop layer 13 in the through hole 120 is removed, the exposed portion of the etch stop layer 13 on the cover portion 11a is also removed to expose the cover portion 11a.

Figure 2E:
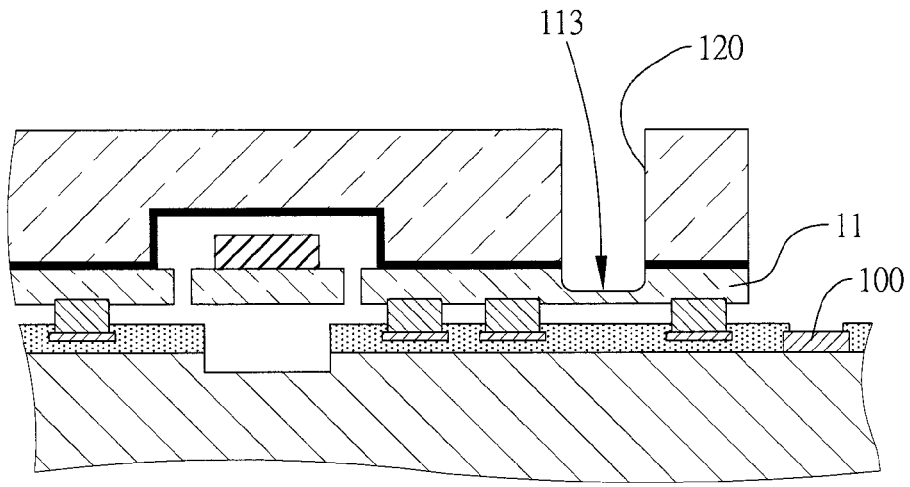

Referring to FIG. 2E, the resist layer 14 is removed. Then, the cover portion 11a and a portion of the first portion 11 in the through hole 120 are removed so as to expose the conductive pad 100 and form a recess 113 in the through hole 120. The recess 111 speeds up the removal of the cover portion 11a.

Figure 2F:
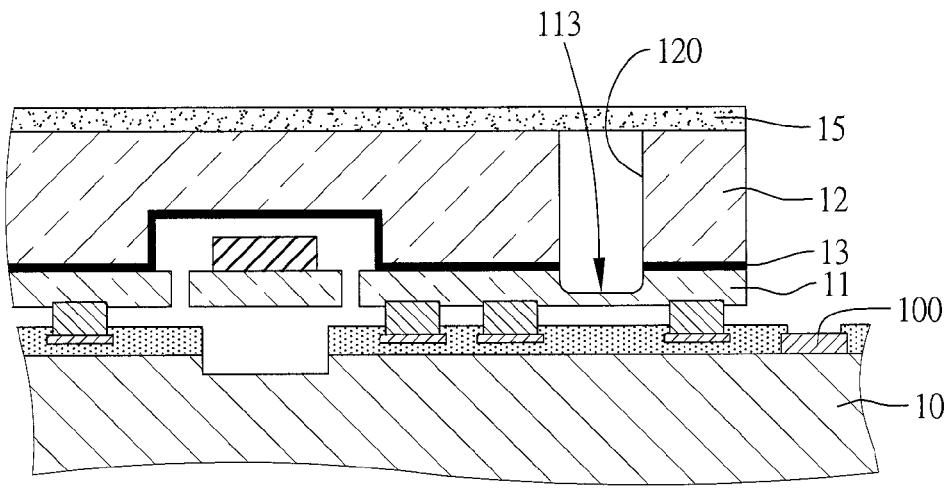

Referring to FIG. 2F, a protection layer 15 is formed on the second portion 12 so as to form a sealed space in the through hole 120 and the recess 113.

Third Embodiment

FIGS. 3A to 3E are schematic cross-sectional views showing a fabrication method of a semiconductor package according to a third embodiment of the present invention. The present embodiment is similar to the first and second embodiments. A main difference of the present embodiment from the first and second embodiments is the fabrication of the recess in the through hole, which is detailed as follows.

Figure 3A:
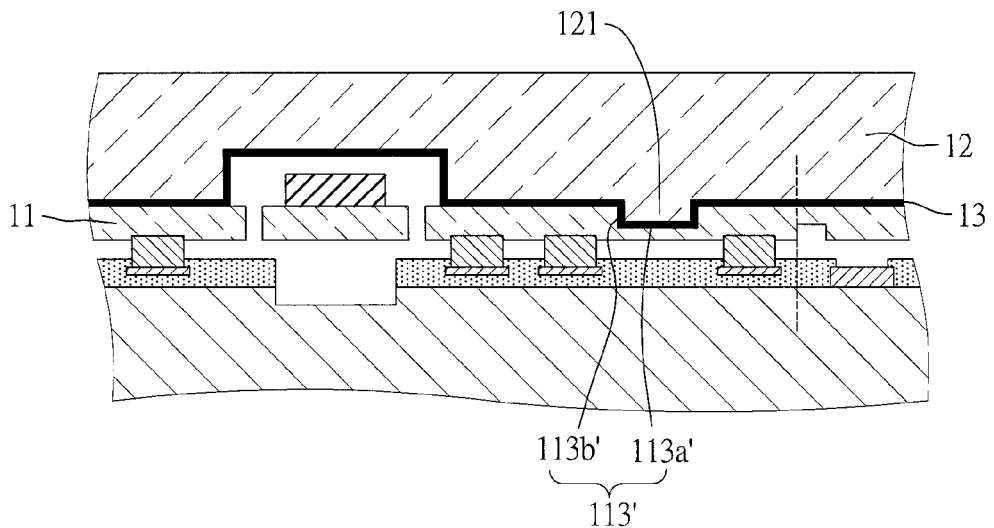
FIGS. 3A to 3E are schematic cross-sectional views showing a fabrication method of a semiconductor package according to a third embodiment of the present invention, wherein FIGS. 3E' and 3E" show other embodiments of FIG. 3E.

Referring to FIG. 3A, a recess 113' having a bottom 113a' and a sidewall 113b' is pre-formed in the first portion 11 and the etch stop layer 13 is formed on the bottom 113a' and the sidewall 113b' of the recess 113'. Further, the second portion 12 has a protruding portion 121 corresponding in position to the recess 113'.

Figure 3B:
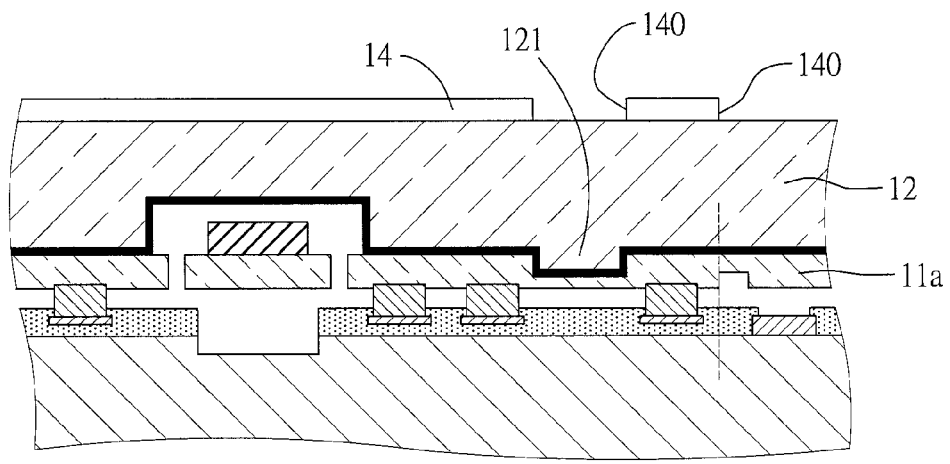

Referring to FIG. 3B, a patterning process as in FIG. 2B is performed such that portions of the second portion 12 over the protruding portion 121 and the cover portion 11a are exposed through the openings 140.

Figure 3C:
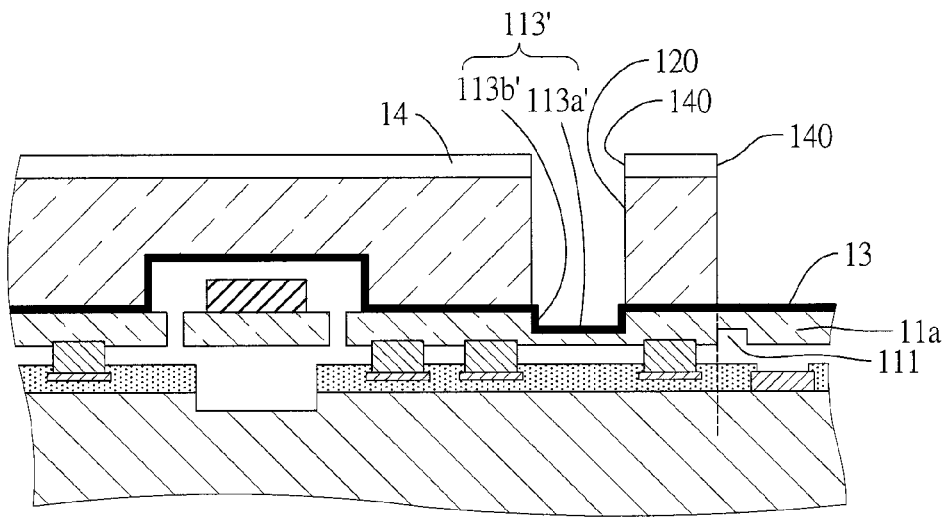

Referring to FIG. 3C, the exposed portions of the second portion 12 (including the protruding portion 121) are removed by etching so as to expose portions of the etch stop layer 13 in the through hole 120 and on the cover portion 11a.

Figure 3D:
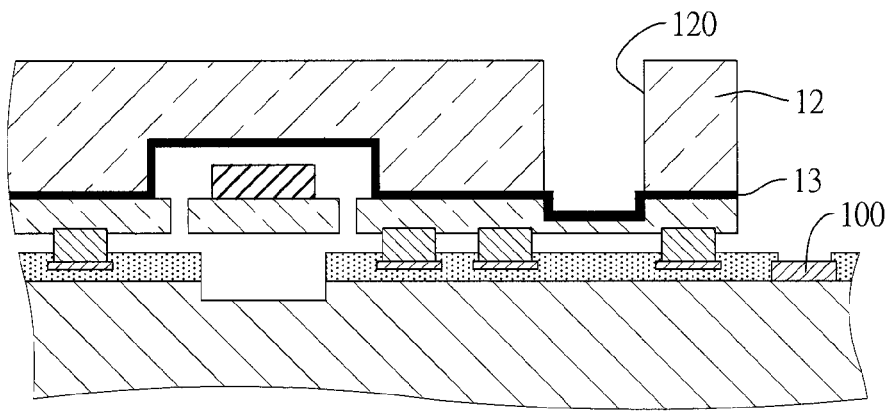

Referring to FIG. 3D, the resist layer 14 is removed. Then, through a cutting or vibration process, the cover portion 11a and the etch stop layer 13 on the cover portion 11a are removed to expose the conductive pad 100. The recess 111 facilitates the removal of the cover portion 11a and the etch stop layer 13 on the cover portion 11a.

Figure 3E:
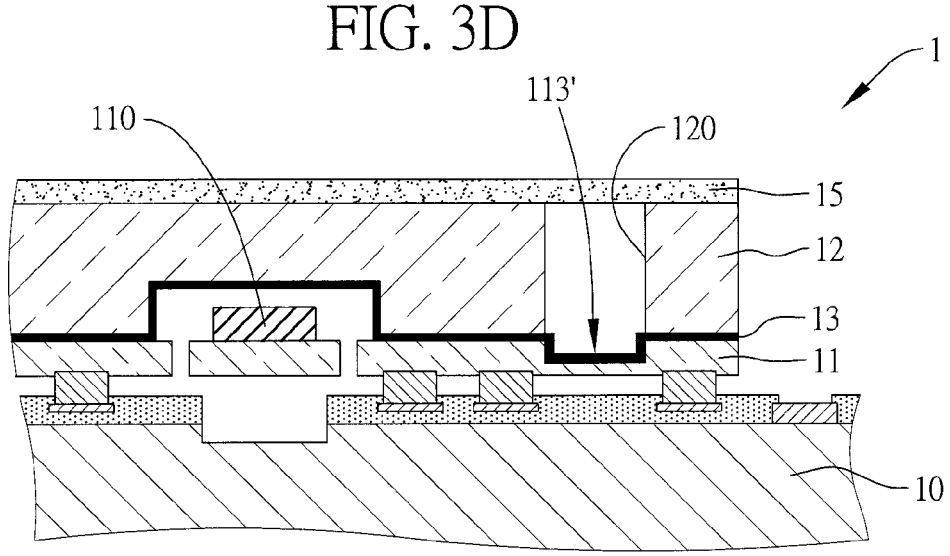
Figure 3E:
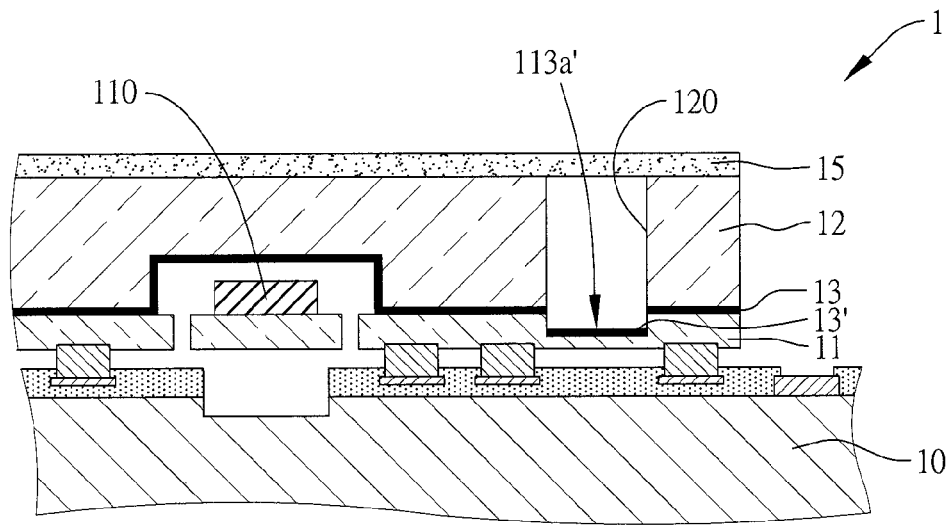

Referring to FIG. 3E, a protection layer 15 is formed on the second portion 12 so as to form a sealed space in the through hole 120 and the recess 113'.

Referring to FIGS. 3E' and 3E", before formation of the protection layer 15, the etch stop layer 13 in the recess 113' can be partially or completely removed by etching. As shown in FIG. 3E', the etch stop layer 13 is partially removed to leave only the etch stop layer 13' on the bottom 113a'. Alternatively, referring to FIG. 3E", the etch stop layer 13 is partially removed to leave only the etch stop layer 13" on the sidewall 113b'.

In the first and second embodiments, since the recess 113 is formed by etching, the bottom 113a of the recess 113 has an arc-shape (as shown in FIGS. 1D and 2E) due to an isotropic effect. On the other hand, in the third embodiment, the recess 113' having a desired shape is fabricated first and then the etch stop layer 13 is formed on the recess 113'. Therefore, during the etching process of FIG. 3C, the etching solution does not damage the etch stop layer 13 on the bottom 113a' of the recess 113', thereby obtaining a carrying surface having a desired shape.

Further, referring to FIGS. 3E' and 3E", if the etch stop layer 13 is partially or completely removed from the recess 113', since the etch stop layer 13 is made of a material different from the first portion 11, the etching solution for etching the etch stop layer 13 does not damage the bottom 113a' or sidewall 113b' of the recess 113', thereby obtaining the carrying surface having a desired shape.

Furthermore, in the first, second and third embodiments, the bottom 113a, 113a' of the recess 113, 113' is used for carrying an electronic element and the thickness of the carrying structure (including the bottom 113a, 113a' and the etch stop layer 13 thereon) can be adjusted according to the practical need. For example, if a thick bottom 113a, 113a' is desired, the etch stop layer 13 can be removed from the bottom 113a, 113a'. On the other hand, if a thin bottom 113a, 113a' is desired, the etch stop layer 13 can be left on the bottom 113a, 113a'. It should be noted that the recess 113, 113' may be dispensed with according to the type of the electronic element to be disposed in the through hole.

In addition, by performing a singulation process in the third embodiment, the present invention provides a semiconductor package 1, which has: a chip having a first portion 11 and a second portion 12 formed on the first portion 11, wherein the second portion 12 has at least a through hole 120 for exposing a portion of the first portion 11; and an etch stop layer 13 formed between the first portion 11 and the second portion 12 and partially exposed through the through hole 120 of the second portion 12.

Further, the semiconductor package 1 can have a substrate 10 for carrying the first portion 11 and the second portion 12 formed on the first portion 11. The semiconductor package 1 can further have a protection layer 15 disposed on the through hole 120 for covering the through hole 120.

The substrate 10 can have a CMOS chip structure and have at least a conductive pad 100 formed at a position corresponding to an outer edge of the first portion 11.

The first portion 11 can have a gyroscope 110. The first portion 11 can be disposed on the substrate 10 through a plurality of bumps 112 so as to form a distance L between the first portion 11 and the substrate 10. Further, the first portion 11 can have a recess 113, 113' in communication with the through hole 120. Therein, the recess 113, 113' has a bottom 113a, 113a' and a sidewall 113b, 113b'. The protection layer 15 can cover the through hole 120 so as to form a sealed space in the through hole 120 and the recess 113, 113'.

The etch stop layer 13', 13" can be formed in the recess 113'. For example, the etch stop layer 13, 13" can be formed on the bottom 113a' and/or the sidewall 113b' of the recess 113' so as to obtain a carrying surface having a desired shape (i.e., the bottom 113a' of the recess 113' and the etch stop layer 13' thereon) for carrying an electronic element.

Therefore, the present invention allows an electronic element to be received in the through hole so as for the semiconductor package to have integrated functions of the MEMS and the electronic element. Therefore, the present invention eliminates the need to dispose the electronic element on a circuit board as in the prior art, thereby saving space on the circuit board and facilitating the development of miniaturized electronic products.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a chip having a first portion and a second portion formed on the first portion, wherein the second portion has at least a through hole therein for exposing a portion of the first portion, the first portion and/or the second portion has a MEMS (Micro-Electro-Mechanical System), the first portion of the chip has a recess in communication with the through hole, and the recess does not penetrate through the first portion;
   and an etch stop layer formed between the first portion and the second portion and partially exposed through the through hole of the second portion.

2. The package of claim 1, further comprising a substrate for carrying the first portion and the second portion formed on the first portion.

3. The package of claim 2, wherein the substrate has at least a conductive pad thereon.

4. The package of claim 2, wherein the first portion of the chip is disposed on the substrate through a plurality of bumps so as to form a distance between the first portion and the substrate.

5. The package of claim 2, wherein the substrate has a chip structure.

6. The package of claim 1, wherein the recess has a bottom in the first portion.

7. The package of claim 6, further comprising a protection layer formed on the through hole so as to form a sealed space in the through hole and the recess.

8. The package of claim 1, further comprising a protection layer covering the through hole.

9. A semiconductor package, comprising:
   a chip having a first portion and a second portion formed on the first portion, wherein the second portion has at least a through hole therein for exposing a portion of the first portion, the first portion and/or the second portion has a MEMS (Micro-Electro-Mechanical System), and the first portion of the chip has a recess in communication with the through hole; and
   an etch stop layer formed between the first portion and the second portion and partially exposed through the through hole of the second portion, wherein the etch stop layer is formed in the recess.

10. The package of claim 9, wherein the recess has a bottom and a sidewall such that the etch stop layer is formed on the bottom or the sidewall of the recess.

11. A fabrication method of a semiconductor package, comprising the steps of:
    providing a wafer having a first portion and a second portion and an etch stop layer formed between the first and second portions, wherein the first portion and/or the second portion has a MEMS;
    etching the second portion so as to form at least a through hole in the second portion for exposing a portion of the first portion, wherein the etch stop layer is partially exposed through the through hole of the second portion, and wherein the first portion having a recess in communication with the through hole, and wherein the recess does not penetrate through the first portion.

12. The method of claim 11, further comprising disposing the first portion on a substrate.

13. The method of claim 12, wherein the substrate has a wafer structure.

14. The method of claim 12, wherein the first portion is disposed on the substrate through a plurality of bumps so as to form a distance between the first portion and the substrate.

15. The method of claim 12, wherein the substrate has at least a conductive pad, and the first portion has a cover portion corresponding in position to the conductive pad.

16. The method of claim 15, further comprising removing the cover portion and the etch stop layer and the second portion on the cover portion so as to expose the conductive pad.

17. The method of claim 15, wherein the cover portion has a recess formed therein and facing the substrate.

18. The method of claim 11, after forming the through hole, further comprising the steps of:

removing the etch stop layer in the through hole so as to expose a portion of the first portion;

removing a portion of the first portion in the through hole so as to form the recess in the first portion, wherein the recess has a bottom in the first portion; and forming a protection layer on the second portion to cover the through hole so as to form a sealed space in the through hole and the recess.

19. The method of claim 11, wherein prior to etching the second portion, the recess has a bottom and a sidewall such that the etch stop layer is formed on the bottom and the sidewall of the recess, and the second portion has a protruding portion received in the recess of the first portion and corresponding in position to the through hole.

20. The method of claim 19, further comprising forming a protection layer on the second portion to cover the through hole so as to form a sealed space in the through hole and the recess.

21. The method of claim 19, further comprising removing at least a portion of the etch stop layer in the recess.

22. The method of claim 21, wherein a portion of the etch stop layer is left on the bottom or the sidewall of the recess.

* * * * *